United States Patent
Li

(10) Patent No.: US 6,713,860 B2
(45) Date of Patent: Mar. 30, 2004

(54) ELECTRONIC ASSEMBLY AND SYSTEM WITH VERTICALLY CONNECTED CAPACITORS

(75) Inventor: Yuan-Liang Li, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/892,273

(22) Filed: Jun. 26, 2001

(65) Prior Publication Data

US 2002/0195700 A1 Dec. 26, 2002

(51) Int. Cl.$^7$ .................. H01L 23/053; H01L 23/04
(52) U.S. Cl. .................. 257/700; 257/758; 257/701; 257/698; 257/773
(58) Field of Search .................. 257/698, 773, 257/692, 303, 306, 308, 309, 700, 758, 701, 125; 174/262, 261; 361/760; 438/118, 622, 623

(56) References Cited

U.S. PATENT DOCUMENTS

| | | | |
|---|---|---|---|
| 4,852,227 A | 8/1989 | Burks ................. | 29/25.42 |
| 4,883,920 A | 11/1989 | Tanabe et al. ........ | 174/68.5 |
| 5,444,298 A | 8/1995 | Schutz ................ | 257/691 |
| 5,798,567 A | 8/1998 | Kelly et al. ......... | 257/723 |
| 5,883,428 A | 3/1999 | Kabumoto et al. .... | 257/691 |
| 5,973,928 A | 10/1999 | Blasi et al. ......... | 361/760 |
| 6,272,020 B1 | 8/2001 | Tosaki et al. ....... | 361/763 |
| 6,344,961 B1 | 2/2002 | Naito et al. ......... | 361/302 |
| 6,388,207 B1 * | 5/2002 | Figueroa et al. ..... | 438/106 |

FOREIGN PATENT DOCUMENTS

| | | | |
|---|---|---|---|
| DE | 10019839 | 6/2001 | .......... H01G/4/005 |
| EP | 0732107 | 9/1996 | .......... A61K/51/04 |

* cited by examiner

Primary Examiner—Nathan J. Flynn
Assistant Examiner—Tan Tran
(74) Attorney, Agent, or Firm—Schwegman, Lundberg, Woessner & Kluth, P.A.

(57) ABSTRACT

An electronic assembly includes one or more discrete capacitors (506, 804, 1204), which are vertically connected to a housing, such as an integrated circuit package (1704). Surface mounted capacitors (506) are vertically connected to pads (602) on a top or bottom surface of the package. Embedded capacitors (804, 1204) are vertically connected to vias (808, 816, 1210, and/or 1212) or other conductive structures within the package. Vertically connecting a surface mounted or embedded capacitor involves aligning (1604) side segments (416) of some of the capacitor's terminals with the conductive structures (e.g., pads, vias or other structures) so that the side of the capacitor upon which the side segments reside is substantially parallel with the top or bottom surface of the package. Where a capacitor includes extended terminals (1208), the capacitor can be embedded so that the extended terminals provide additional current shunts through the package.

35 Claims, 10 Drawing Sheets

ELECTRONIC ASSEMBLY AND SYSTEM WITH VERTICALLY CONNECTED CAPACITORS

TECHNICAL FIELD OF THE INVENTION

The present invention relates generally to apparatus for providing capacitance to an electronic circuit, and more particularly to providing capacitance to an integrated circuit load, and methods of manufacturing an electronic assembly that includes discrete capacitors electrically connected to a housing.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. This noise can arise due to inductive and capacitive parasitics, for example, as is well known. To reduce such noise, capacitors known as bypassing capacitors are often used to provide a stable signal or stable supply of power to the circuitry. Capacitors can also be used to suppress unwanted radiation, to dampen voltage overshoot when an electronic device (e.g., a processor) is powered down, and to dampen voltage droop when the device powers up.

Bypassing capacitors are generally placed as close as practical to a die load or "hot spot" in order to increase the capacitors' effectiveness. Often, the bypassing capacitors are surface mounted to the die side or land side of the package upon which the die is mounted, or embedded within the package itself. FIG. 1 illustrates a cross-section of an integrated circuit package 102 having die side capacitors 106 ("DSC") and land side capacitors 108 ("LSC") in accordance with the prior art. Die side capacitors 106, as their name implies, are mounted on the same side of the package 102 as the integrated circuit die 104. In contrast, LSCs 108 are mounted on the opposite side of the package 102 as the die 104. Embedded chip capacitors ("ECC") are not illustrated in FIG. 1, but would be embedded within the package 102 and electrically connected to package planes and/or pads through conductive vias.

As FIG. 1 illustrates, the capacitors' terminals are connected to the integrated circuit load through pads, vias 110, and power or ground planes 112, 114 within the package, thus enabling the capacitors 106, 108 to provide bypassing capacitance to the integrated circuit. Connection of the capacitors 106, 108 to the load through pads, vias 110, and power or ground planes 112, 114 results in some "vertical" inductance, also referred to as "loop" inductance, to exist in the supply and return via loop between each capacitor 106, 108 and the integrated circuit load. According to some existing packaging technologies, the loop area results in about 15–20 picohenrys (pH)/square of vertical inductance. This loop inductance tends to slow the response time of off-chip capacitors.

Typically, multiple bypassing capacitors are used to provide the desired capacitance. FIG. 2 illustrates a bottom view of an integrated circuit package 202 having multiple LSCs 204, which are electrically connected to pads 206 on the bottom of the package 202 in accordance with the prior art. The cross-hatching on terminals 208 is intended to indicate that terminals 208 and pads 206 typically are connected, in an alternating manner, to power and ground planes (e.g., planes 112, 114, FIG. 1) within the package 202. The electrical connection between the discrete capacitor 204 and the package 202 is accomplished by soldering each terminal 208 of each LSC 204 to a designated pad 206. Accordingly, where eight-terminal, discrete capacitors are used, as shown in FIG. 2, eight electrical connections exist between the capacitor 204 and the package pads 206. Analogous figures could be used to illustrate the connection of DSC terminals to package pads, or the connection of ECC terminals to vias within the package.

Because the capacitors 204 are interconnected through different sets of pads, vias (e.g., vias 110, FIG. 1), and power or ground planes (e.g., planes 112, 114, FIG. 1) within the package, some "lateral" inductance also exists between the capacitors 204. In other words, the lateral current between capacitors 204 is carried over a conductive loop having a loop area that is bounded by various conductive structures (e.g., pads, vias, and power/ground planes) of the package 202. According to some existing packaging technologies, the loop area results in about 15–30 pH/square of lateral inductance, where the amount of vertical inductance is inversely proportional to the number of power and ground planes interconnecting the capacitors. Similar to the effect of vertical inductance, described above, lateral inductance tends to slow the response time of off-chip capacitors.

FIG. 3 illustrates an electrical circuit that simulates the electrical characteristics of the capacitors illustrated in FIGS. 1–2. For simplicity, no parasitic resistances of the capacitors are shown in FIG. 3. The circuit shows a die load 302, which may require bypassing capacitance in order to function properly. Some of the bypassing capacitance can be supplied by capacitance, modeled by capacitor 304, located on the die. Other capacitance, however, must be provided off chip, as modeled by off-chip capacitors 306. The off-chip capacitors 306 could be, for example, DSCs, LSCs, and/or ECCs (e.g., capacitors 106, 108, FIG. 1).

As described previously, lateral inductance, modeled by inductors 308, exists between capacitors 306. In addition, vertical inductance, partially modeled by inductor 310, exists between capacitors 306 and die load 302. For simplicity, a vertical inductance component for each capacitor is not shown.

Because lateral and vertical inductances tend to slow the response time of off-chip capacitors 306, it is desirable to minimize the magnitudes of these inductances. For LSCs and DSCs, vertical inductance can be reduced by using capacitors with interdigital contacts. Even with interdigital capacitors, the number of discrete devices that can be mounted to or embedded within a package is limited by the capacitors' dimensions (i.e., the length and width). Thus, the amount of capacitance that can be provided by these off-chip capacitors is also limited by the capacitors' dimensions, among other things.

Besides using interdigital capacitors, vertical inductance issues can be addressed by placing off-chip capacitors 306 as electrically close as possible to the die load, such as by using ECCs, which typically can be placed closer to the load than surface mounted capacitors. Similarly, lateral inductance issues can be addressed by placing adjacent capacitors close to each other. For example, adjacent capacitors are sometimes connected to adjacent pads on the package.

Although these solutions are sufficient in certain cases, as the frequencies and edge rates of electronic devices continue to advance, there is an increasing need for higher levels of bypassing capacitance. In addition, there is a need for capacitance solutions that minimize the vertical and lateral inductances associated with off-chip capacitors.

Accordingly, there is a need for alternative capacitance solutions in the fabrication and design of electronic assemblies, such as integrated circuit packages.

DETAILED DESCRIPTION OF THE INVENTION

Figure 1:
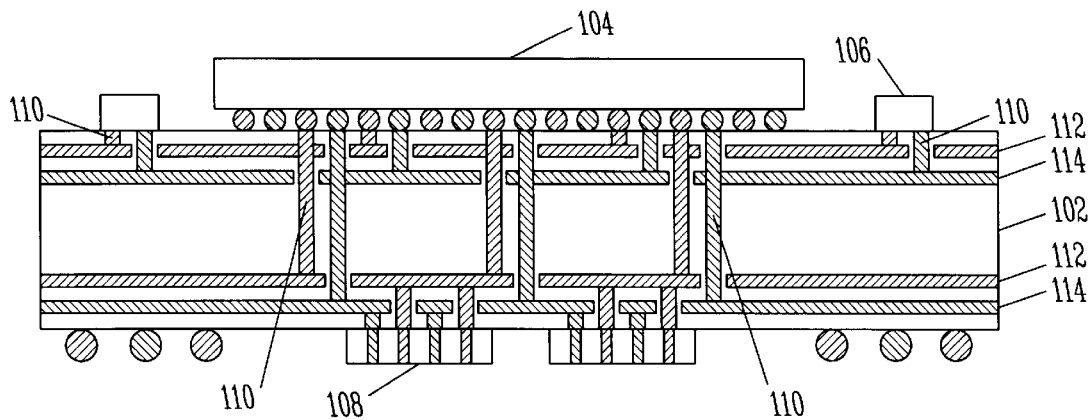
FIG. 1 illustrates a cross-section of an integrated circuit package having die side and land side capacitors in accordance with the prior art.

Various embodiments of the present invention provide off-chip capacitance at reduced vertical and lateral inductance levels for bypassing, voltage dampening, and supplying charge. In various embodiments, discrete capacitors are vertically connected to a housing, rather than horizontally connecting them, as is done in the prior art. Vertical connection of discrete capacitors in accordance with the various embodiments enables more capacitors to be embedded within or surface mounted to the package. Accordingly, the various embodiments enable more off-chip capacitance to be supplied to die loads without increasing package sizes.

The various embodiments can be used to reduce the vertical and lateral inductance present between LSCs, DSCs, ECCs or other discrete capacitor configurations and their associated loads. In various embodiments, this is accomplished by using an existing feature inside discrete, multilayer capacitors. This feature, which is the extremely low lateral inductance inside these capacitors, is exploited to reduce the vertical inductance between capacitors and die loads, and the lateral inductance between the capacitors themselves.

In one embodiment, the discrete capacitors are embedded within the housing in a vertically connected configuration, thus providing an extremely low inductance path between other capacitors connected to the land side of the housing and the die load, resulting in a reduced vertical inductance between LSCs and the die loads. In another embodiment, along with vertically connecting the capacitors, the terminals of adjacent, discrete capacitors are electrically connected together, rather than relying on electrical connections formed from conductive structures within or on the surface of a package. This results in a reduced lateral inductance between the capacitors.

These direct connections, referred to herein as "lateral connections," result in extremely low lateral inductances between LSCs, DSCs, and ECCs. Basically, the lateral connections of the various embodiments provide lateral current paths between the discrete capacitors. By utilizing lateral connections between the numerous conductive planes within the discrete capacitors, the various embodiments provide a high-frequency current redistribution network for the power delivery system.

When a voltage droop occurs, embedded capacitors typically will respond first (i.e., will supply needed current to bolster the die voltage). When the embedded capacitor charge begins to deplete, and the voltage droop again occurs, DSCs and/or LSCs typically will respond second. Due to the lower vertical and/or lateral inductances provided by the various embodiments, the response times of these first and second off-chip capacitances are shortened, thus reducing the negative effects of these first and second level voltage droops.

Also, in various embodiments, as will be explained in detail below, discrete capacitors having terminals that extend across an entire side of the capacitor are vertically connected, and these extended terminals are used to provide additional DC shunts through the package. These embodiments are particularly useful in higher current applications, although they can be used in lower current applications as well.

Although the description of the various embodiments refers primarily to using discrete capacitors in conjunction with an integrated circuit package, the various embodiments also could be used in conjunction with other types of packages, interposers, printed circuit boards or other electronic circuit housings. In other words, the various embodiments could be used in conjunction with various types of electronic assemblies, and is not meant to be limited to use with integrated circuit packages. In addition, the various embodiments could be used with a number of different types of packages and packaging technologies. For example, the various embodiments could be used with organic or ceramic packages, and the packaging technologies with which the embodiments could be used include but are not limited to, land grid array (e.g., organic LGA), pin grid array (e.g., plastic PGA or flip chip PGA), ball grid array (e.g., BGA, tape BGA, plastic BGA, flip chip BGA or flip chip tape BGA), tape automated bonding, wire bonding, and beam lead.

A number of different types of discrete capacitors can be used in various embodiments. These capacitors can have different numbers of terminals (e.g., 2, 4, 8, 10, 12, etc.) on a various number of sides (e.g., 1, 2, 3, 4, etc.). For the purposes of illustration and ease of explanation, the description below uses eight-terminal and ten-terminal capacitors to describe the various embodiments.

Figure 4:
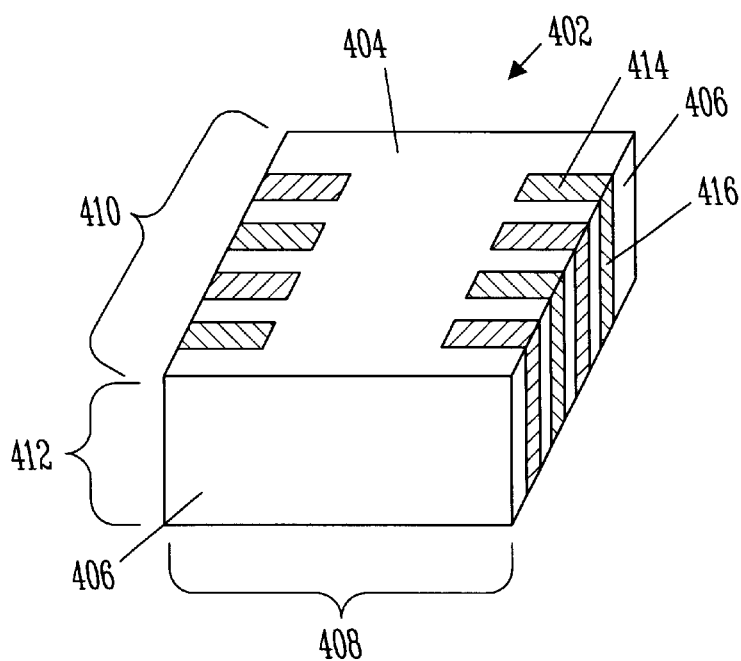
FIG. 4 illustrates a three-dimensional view of a typical eight-terminal, discrete capacitor.

FIG. 4 illustrates a three-dimensional view of a typical eight-terminal, discrete capacitor 402. Capacitor 402 includes a housing with a top surface 404, a bottom surface, and four side surfaces 406. Typically, a width 408 and length 410 of capacitor 402 are greater (e.g., by two or more times) than a height 412 of capacitor 402.

Figure 2:
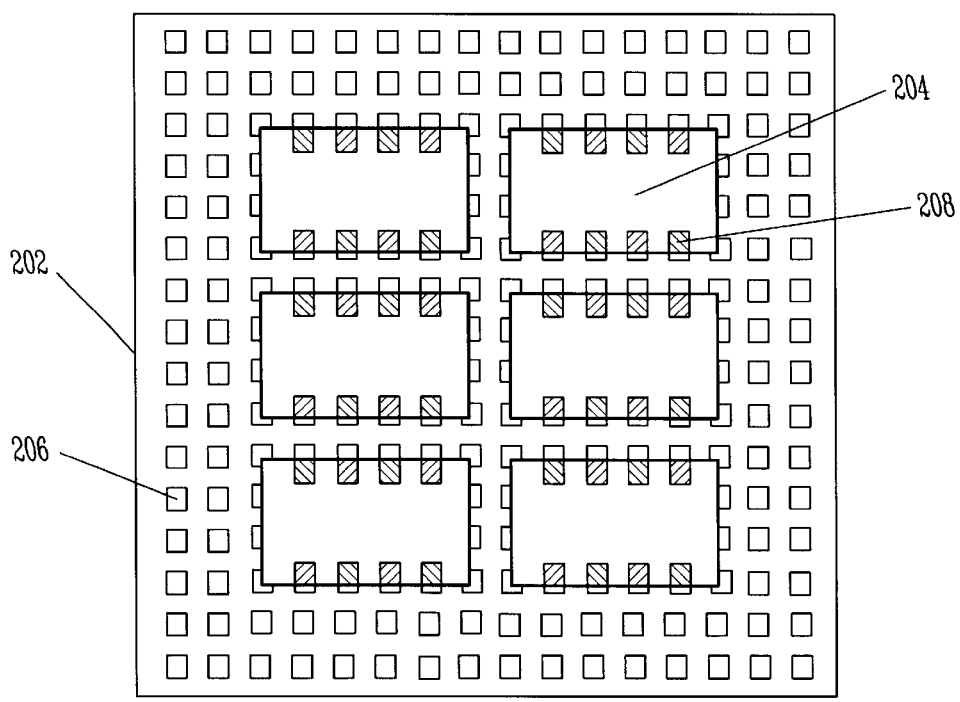
FIG. 2 illustrates a bottom view of an integrated circuit package having multiple LSCs, which are electrically connected to pads on the bottom of the package, in accordance with the prior art.
Figure 3:
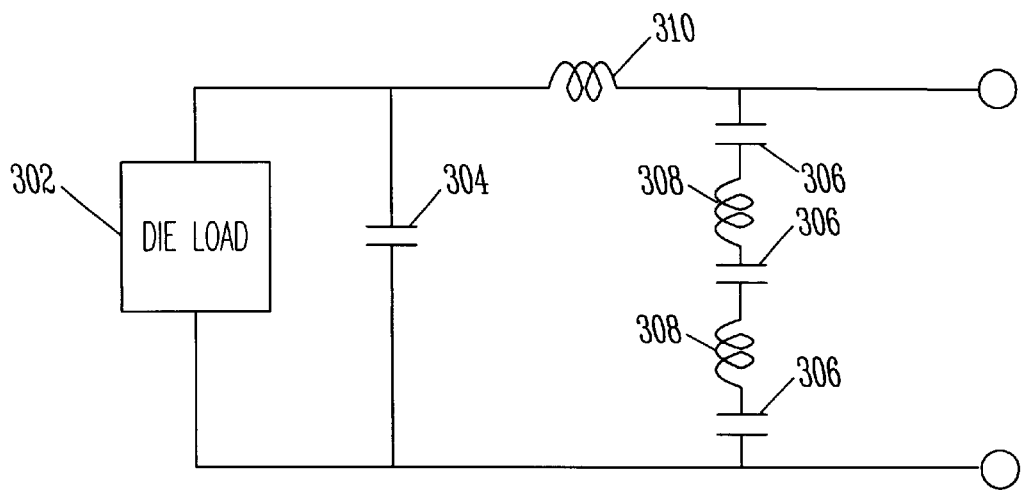
FIG. 3 illustrates an electrical circuit that simulates the electrical characteristics of the capacitors illustrated in FIGS. 1–2.

The capacitor's terminals provide electrical connections to capacitive structures within capacitor 402. Each terminal includes a top segment 414 formed on the top surface 404, and a side segment 416 formed on a side surface 406. In addition, each terminal could have a bottom segment (not shown) formed on the bottom surface. Using prior art technologies, when capacitor 402 is surface mounted on a package (e.g., package 202, FIG. 2), each of the top segments 414 (or bottom segments) are placed in contact with and soldered to a package pad. When capacitor 402 is embedded within a package, using prior art technologies, conductive vias are formed in the package to make electrical contact with each of the top segments 414 and/or bottom segments.

When capacitor 402 is a multi-layer capacitor, it includes multiple planes (not shown) of conductive material, separated by layers of dielectric material. Within a multi-layer capacitor, numerous planes are usually present (e.g., hundreds of planes).

Typically, these conductive planes are configured so that alternating planes connect to alternating terminals around the capacitor. This enables the terminals and planes to be connected, in an alternating manner, to pads on a package body. These pads, in turn, connect to either power or ground planes within the package body through plated or filled vias.

Figure 5:
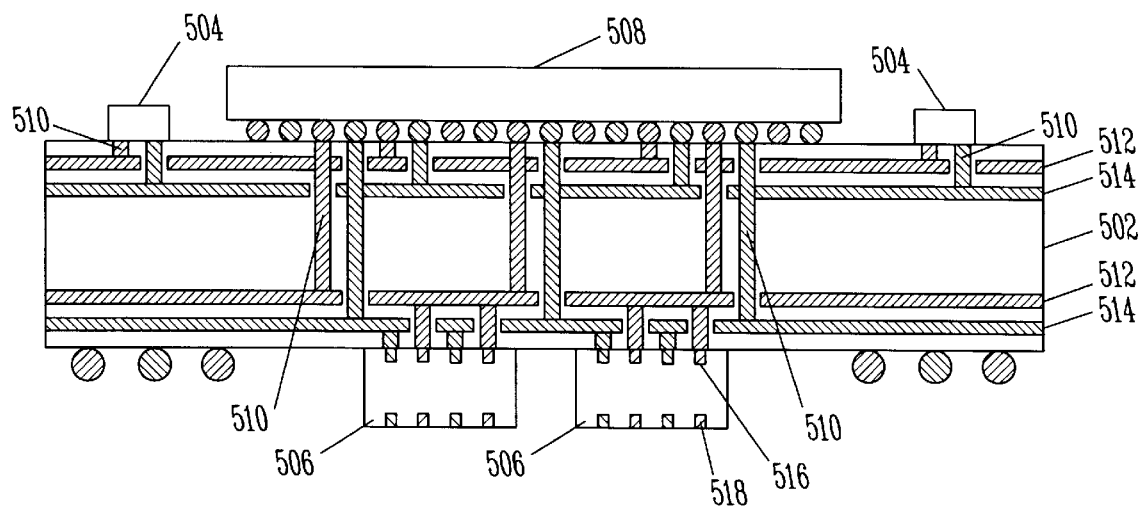
FIG. 5 illustrates a cross-sectional view of an integrated circuit package having multiple surface mounted capacitors in accordance with one embodiment of the present invention.

FIG. 5 illustrates a cross-sectional view of an integrated circuit package 502 having multiple surface mounted capacitors 504, 506 in accordance with one embodiment of the present invention. Capacitors 504, 506 could be, for example, ceramic chip capacitors, organic capacitors, integrated circuit capacitors or other types of discrete capacitors.

The terminals of DSCs 504 and LSCs 506 are connected to one or more loads within integrated circuit 508 through pads (not shown), vias 510, and power or ground planes 512, 514 within the package. This enables capacitors 504, 506 to provide bypassing capacitance to the integrated circuit 508. For ease of description, FIG. 5 does not completely illustrate all of the various conducting and non-conducting layers that a package may have. Layers above and/or below planes 510, 512 may also exist.

In one embodiment, LSCs 506 are vertically connected to package 502. This means that the terminals 516 on only one side of LSCs 506 are connected to package pads, and the terminal-to-pad connections are made so that the side segments (e.g., segment 416, FIG. 4) of these capacitor terminals 516 are substantially parallel to the surface of each pad. In other words, LSCs 506 are connected to package 502 so that the side of the capacitor (i.e., the plane defined by the capacitor's height and length (e.g., height 412 and length 410, FIG. 4)) is substantially parallel to the top or bottom surface of the package 502. As described previously, prior art assemblies are constructed so that the capacitors are horizontally connected to a package. The various embodiments of the present invention are distinguishable over the prior art because, using the prior art, horizontal connection methods, terminals on more than one side of the capacitor are connected to the package pads, the terminals are connected on the top or bottom terminal segments, and the plane defined by the capacitor's width and length (e.g., width 408 and length 412, FIG. 4) is substantially parallel to the bottom surface of the package.

In one embodiment, LSCs 506 include eight terminals 516, 518 distributed on two sides. Because LSCs 506 are vertically connected, only four of the eight terminals 516 are electrically connected to pads on package 502. The other four terminals 518 are physically separated from the package by approximately the width of the LSC 506. The cross-hatching present on terminals 516, 518 is intended to indicate that terminals 516, 518 are connected either to positive or negative interior planes within the LSCs 506. In addition, the four terminals 516 that are connected to package 502 are connected, in an alternating manner, to power and ground planes 512, 514 within the package 502.

As will be explained and exemplified below, capacitors having more or fewer terminals distributed on more or fewer sides also could be used in conjunction with various embodiments. In addition, the polarities of the terminals need not strictly alternate between adjacent terminals. The description of the various embodiments given in conjunction with FIGS. 5 and 6 focuses on vertically connecting LSCs 506 to package 502. In other configurations, the various embodiments also could be used with vertically connected DSCs 504, or a combination of vertically connected LSCs 506 and DSCs 504 could be used.

Figure 6:
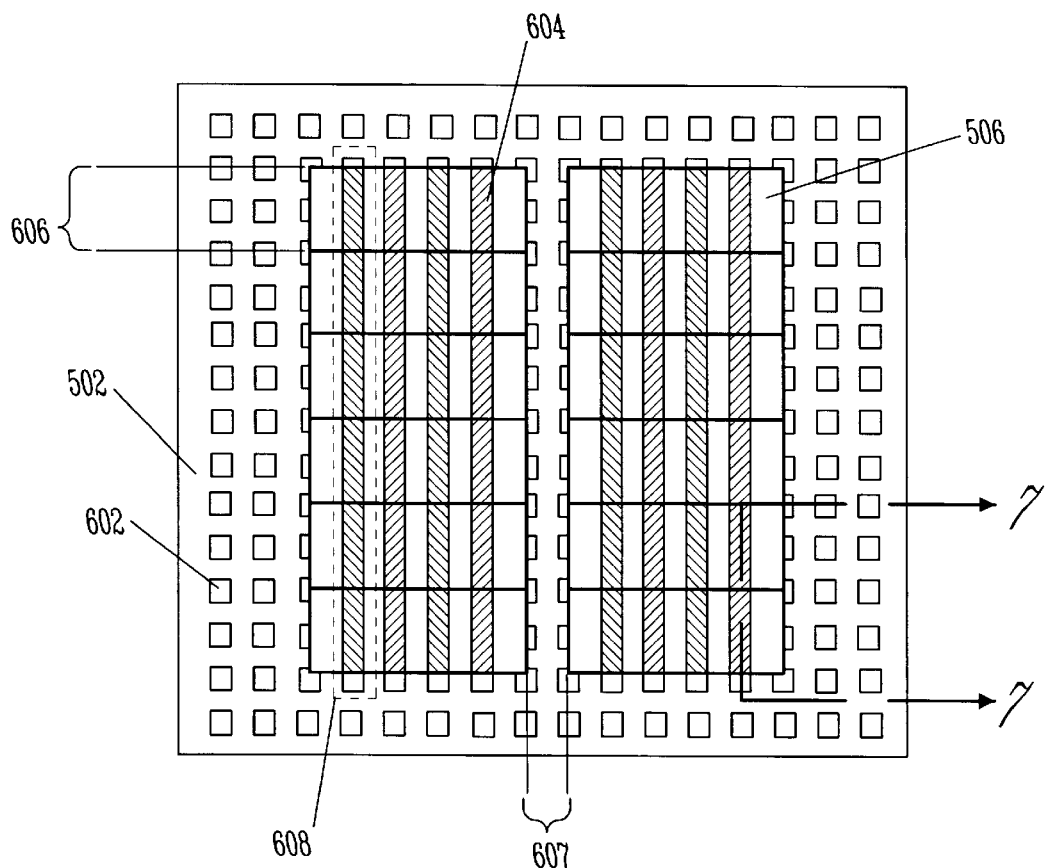
FIG. 6 illustrates a bottom view of a portion of the integrated circuit package and surface mounted capacitors of FIG. 5.

FIG. 6 illustrates a bottom view of a portion of the integrated circuit package 502 and surface mounted capacitors 506 of FIG. 5. In the example configuration shown, two rows of six capacitors 506 each are vertically connected to pads 602 of package 502. Although a gap 607 of about one pad pitch exists between the rows of capacitors 506, the rows could be farther apart or closer together (e.g., the rows could touch) as well. The twelve capacitors 506 are arranged along substantially parallel planes. The side segments 604 of four terminals are visible on each capacitor 506, and the terminals alternate between positive and negative polarities, as indicated by the alternating cross-hatching patterns.

On a typical discrete capacitor, the height 606 (or 412, FIG. 4) of the capacitor is smaller than the width (e.g., width 408, FIG. 4). Accordingly, using various embodiments of the present invention, more discrete capacitors can be vertically connected to the package 502 within the same package surface area than can be horizontally connected to the package.

Although only twelve capacitors 506 are shown in the figure, more or fewer capacitors could be used as well. In some prior art solutions, for example, thirty or more horizontally connected capacitors might be used to supply off-chip capacitance to a die. Using the various embodiments of the present invention, sixty or more vertically connected capacitors could occupy the same amount of package surface area, where the number of additional capacitors that could be connected depends, in part, on the ratio of the capacitor's width to the capacitor's height. Using the embodiments of the present invention, more bypassing capacitance can be provided without affecting the package size.

In one embodiment, two or more of the vertically connected capacitors 506 are also "laterally connected" together. This means that some of the terminals 518 and/or 516 (FIG. 5) of adjacent, discrete capacitors 506 are electrically connected together without relying on electrical connections formed from conductive structures within or on the surface of package 502. In other embodiments, capacitors 506 are not laterally connected together.

Each lateral connection is between adjacent terminals having the same polarity. Accordingly, a positive terminal of a first discrete capacitor would be laterally connected to a positive terminal of a second, adjacent discrete capacitor. In this manner, a lateral current path can be formed across an entire row 608 of adjacent, laterally connected capacitor terminals. The construction of the lateral connections and their advantages will be described in more detail in conjunction with FIG. 7.

Figure 7:
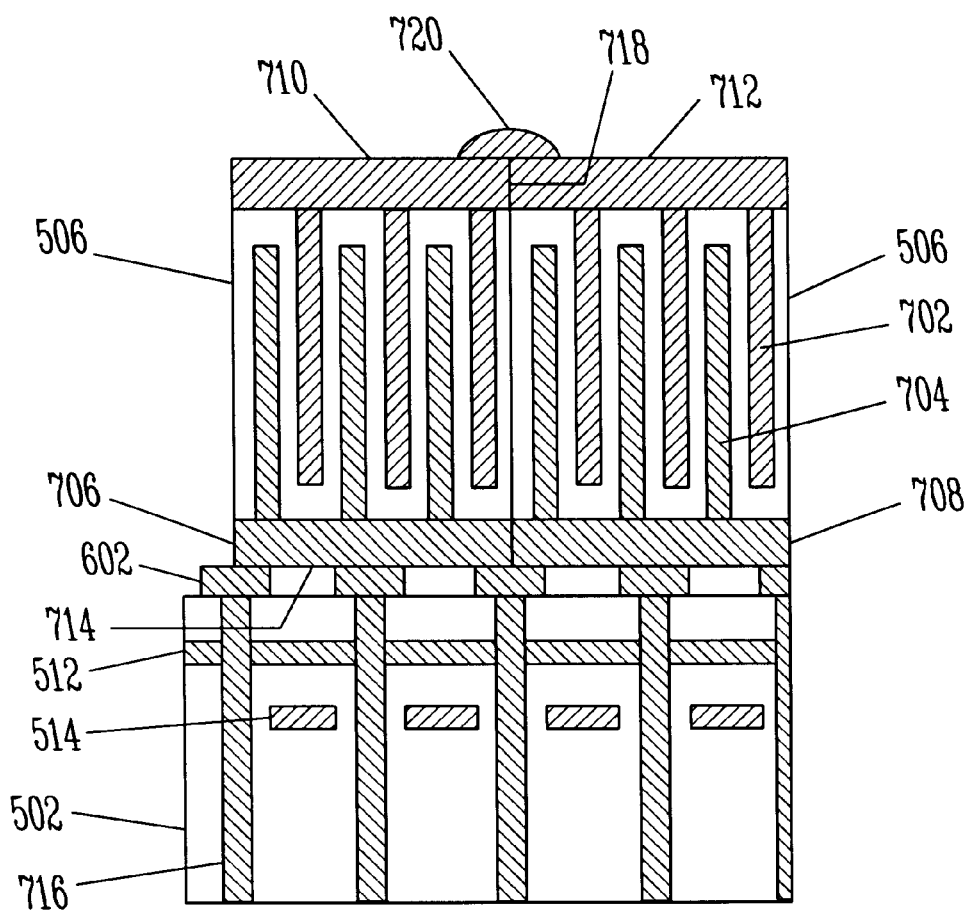
FIG. 7 illustrates a cross-sectional view of a portion of the integrated circuit package and surface mounted capacitors FIG. 6 along section lines A—A.

FIG. 7 illustrates a cross-sectional view of a portion of the integrated circuit package 502 and surface mounted capacitors 506 of FIG. 6 along section lines A—A. As described previously, when capacitors 506 are multi-layer capacitors, they include multiple planes 702, 704 of conductive material, separated by layers of dielectric material. These conductive planes 702, 704 are typically configured so that alternating planes connect to alternating conductive terminals 706, 708, 710, 712 around the exterior of each capacitor.

In one embodiment, capacitors 506 are vertically connected to pads 602 on package 502, meaning that the side surface and/or side segments 714 of terminals 706, 708 are substantially parallel to the package's top or bottom surface, and the side segments 714 are directly connected to pads 602. Pads 602, in turn, are electrically connected to power and ground planes 512, 514 within package 502 through vias 716. In contrast to terminals 706, 708, terminals 710, 712 are not directly connected to pads 602 on package 502. Although the terminals 706, 708 of the two capacitors 506 are shown to be connected to three pads each, they could be connected to more or fewer pads as well.

In one embodiment, as described in conjunction with FIG. 6, some or all capacitors 506 are laterally connected to one or more other capacitors 506. This is accomplished, in one embodiment, by forming direct electrical connections between adjacent terminals of adjacent capacitors 506. These direct electrical connections could be formed by physical contact and/or by providing a conductive material to connect adjacent terminals. Lateral connections could be formed between the top terminals 710, 712 and also between the bottom terminals 706, 708. Alternatively, a lateral connection could be formed between only the top terminals 710, 712 or the bottom terminals 706, 708, but not both sets of terminals.

In one embodiment, little or no physical distance exists between adjacent capacitors 506. In this embodiment, top and/or bottom segments 718 of the terminals 706, 708, 710, 712 of adjacent capacitors 506 are in physical contact with each other or have a negligible distance between each other.

In another embodiment, a non-negligible distance exists between capacitors 506, and the lateral connection is formed across an elongated pad. For example, the elongated pad could cover substantially all of the distance between what would otherwise be two, adjacent standard sized pads (e.g., standard sized pads 602). This enables capacitors 506 to be placed on the package with the equivalent of a standard pad pitch of distance between them. Shorter or longer elongated pads could be used as well.

In one embodiment, the lateral connection is achieved using a conductive material 720 to connect the adjacent terminals 706, 708 and/or 710, 712. Because terminals 706, 708 are so close together, the conductive material is not illustrated between these terminals. The conductive material 720 could be, in various embodiments, solder or a cured, conductive paste or adhesive, for example. Besides forming terminal-to-terminal connections, the conductive material 720 could also be used to connect the terminals 706, 708 to the package pads 602, or separate applications of conductive material could be used to achieve the terminal-to-pad and terminal-to-terminal connections.

In prior art systems, discrete capacitors are not laterally connected, but instead are interconnected only through conductive structures within the package (e.g., combinations of pads, vias, and power or ground planes). In accordance with the various embodiments, because capacitors 506 are interconnected directly through lateral connections, and are not interconnected only through conductive structures within the package, the lateral inductance between the capacitors 506 is substantially reduced. In other words, the lateral current between capacitors 506 is carried substantially over the lateral connections, rather than over a conductive loop having a loop area that is bounded by various conductive structures of the package. Accordingly, the lateral connections have been shown to reduce the lateral inductance to fractions of picohenrys (e.g., 0.03 pH/square or less) from tens of picohenrys that result from using prior art technologies. By utilizing lateral connections to interconnect the conductive planes 702, 704 within the discrete capacitors 506, a high frequency current redistribution network for the power delivery system is provided. This effective redistribution of high frequency current results in substantially reduced system noise and more effective usage of bypassing capacitors. In addition, by reducing the system noise, the various embodiments can increase manufacturing yields and decrease the number of bypassing capacitors needed, thus reducing costs.

In various embodiments, such as those described in conjunction with FIGS. 5–7, LSCs and/or DSCs are vertically connected to a package. In still other embodiments, discrete capacitors can be embedded within a package in a vertically connected manner.

Figure 8:
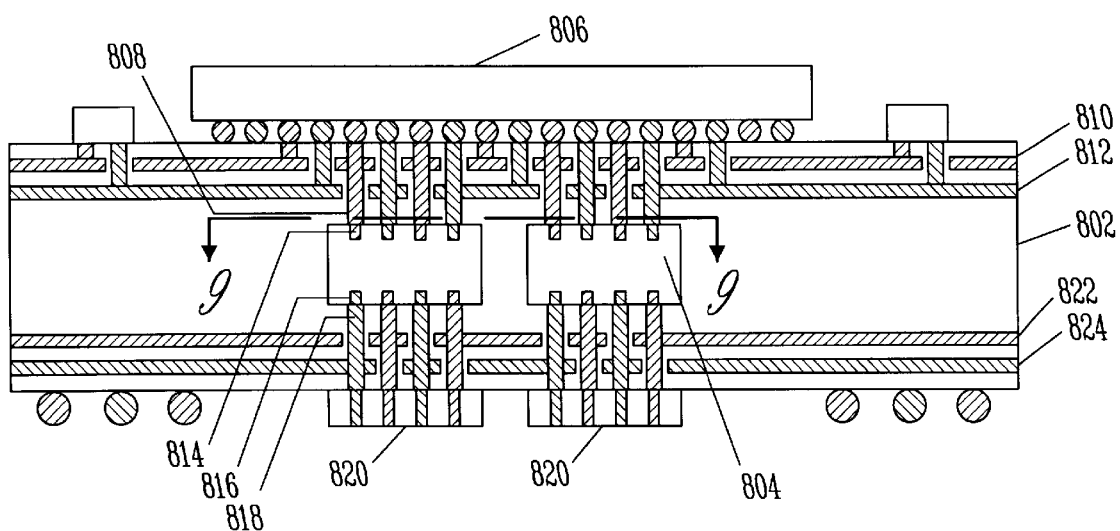
FIG. 8 illustrates a cross-sectional view of an integrated circuit package having multiple embedded capacitors in accordance with another embodiment of the present invention.

FIG. 8 illustrates a cross-sectional view of an integrated circuit package 802 having multiple embedded capacitors 804 (ECCs) in accordance with another embodiment of the present invention. ECCs 804 could be, for example, ceramic chip capacitors, organic capacitors, integrated circuit capacitors or other types of discrete capacitors.

In one embodiment, ECCs 804 are vertically embedded within package 802. This means that the terminals 814 on a first side of an ECC 804 are available to be connected to embedded conductive structures, such as vias 808 (referred to herein as "die-side vias") that extend toward the top surface (i.e., the die side) of package 802. Terminals 816 on a second, opposite side of an ECC 804 are available to be connected to other embedded conductive structures, such as vias 818 (referred to herein as "land-side vias") that extend toward the bottom surface (i.e., the land side) of package 802.

Some or all die-side terminals 814 are connected to one or more loads within integrated circuit 806 through the die-side vias 808. This enables ECCs 804 to provide bypassing capacitance to the integrated circuit 806. In addition, in one embodiment, some or all land-side terminals 816 are electrically connected to one or more LSCs 820. This electrical connection is at least partially accomplished using land-side vias 818 and/or planes 822, 824 or other traces. In another embodiment, terminals 816 do not connect to LSCs 820.

The vertical, terminal-to-via connections are made so that the side surfaces and/or side segments (e.g., segment 416, FIG. 4) of the capacitor terminals 814, 816 are substantially parallel to the top or bottom surface of the package 802. In other words, ECCs 804 are embedded within package 802 so that the plane defined by the capacitor's height and length (e.g., height 412 and length 410, FIG. 4) is substantially parallel to the top or bottom surface of the package 802. Prior art assemblies are constructed so that embedded capacitors are horizontally connected. The various embodiments of the present invention are distinguishable over the prior art because, using the prior art, horizontal connection methods, terminals on more than one side of the capacitor are connected to the die-side or land-side vias, the terminals are connected on the top or bottom terminal segments, and the plane defined by the capacitor's width and length (e.g., width 408 and length 412, FIG. 4) is substantially parallel to the top or bottom surface of the package.

One advantage to the present invention is that vertically connected ECCs 804 provide an extremely low inductance path between LSCs 820 and die 806. As described previously, in prior art systems, LSCs (e.g., LSCs 108, FIG. 1) are connected to the load through vias (e.g., vias 110, FIG. 1) and power and ground planes. The vias are relatively high inductance structures, which result in a significant amount of vertical (or loop) inductance in the supply and return via loop between each LSC and the integrated circuit load. This loop inductance tends to slow the response time of off-chip capacitors.

In contrast, the vertically connected ECCs 804 of the various embodiments replace at least a portion of the high inductance vias. Because the numerous conductive planes within capacitors 804 have a very low lateral inductance, ECCs 804 substantially reduce the vertical inductance between LSCs 820 and die 806. Accordingly, the vertically connected ECCs 804 have been shown to reduce the vertical inductance to fractions of picohenrys (e.g., 0.03 pH/square or less) from tens of picohenrys that result from using prior art technologies. These vertically connected ECCs can substantially reduce the first level voltage droop, which was described in the background. In addition, by reducing the vertical inductance and thereby enhancing the performance of LSCs 820 and other bypassing capacitors (not shown), which may be located on an interposer or printed circuit board, the various embodiments can substantially reduce the second level voltage droop, as well.

FIG. 8 does not completely illustrate the various conducting and non-conducting layers of package 802, for ease of description. In an actual package design, one or more additional conducting and/or non-conducting layers could exist above, below, or in parallel with ECCs 804. This is also true of the embodiments illustrated in FIGS. 10, 12, and 14). In order to minimize the loop inductance between ECCs 804 and a die load, it may be desirable to embed ECCs 804 as close to the top surface of the package 802 as possible, although this is not essential. The capacitors could be embedded in one or multiple layers of a single package. In addition, although the embodiments illustrated in FIGS. 8, 10, 12, and 14 show LSCs and DSCs as being horizontally connected to a package, either or both LSCs or DSCs could be vertically connected as described herein, as well.

Figure 9:
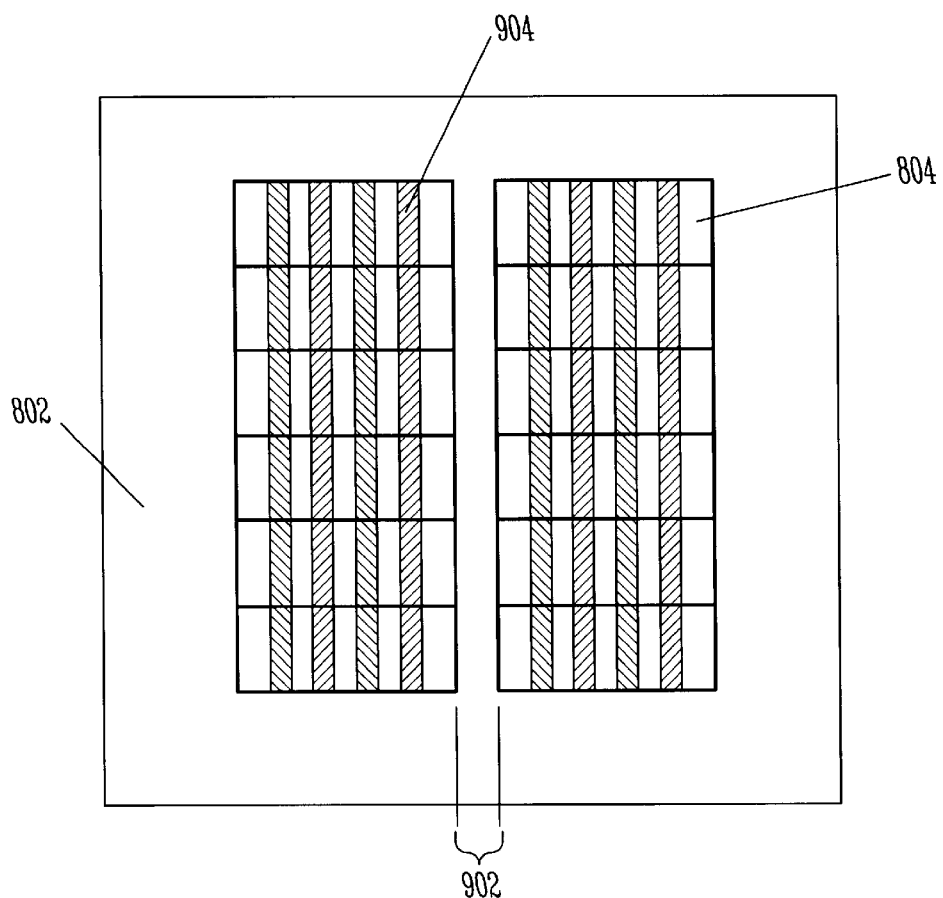
FIG. 9 illustrates a cross-sectional view of a portion of the integrated circuit package of FIG. 8 along section lines A—A.

FIG. 9 illustrates a cross-sectional view of a portion of the integrated circuit package 802 of FIG. 8 along section lines A—A. The embodiment illustrated in FIG. 9 is similar to the embodiment illustrated in FIG. 6, except that capacitors 804 are embedded within package 802, rather than being surface mounted to the package. Accordingly, the terminals 814 of ECCs 804 are connected to conductive structures within package 802 (e.g., planes, traces, and/or vias 808, 818, FIG. 8), rather than being connected to pads on the surface of the package.

In the example configuration shown, two rows of six capacitors 804 each are vertically connected to conductive structures (e.g., vias 808, 818, FIG. 8) within package 802. Although a gap 902 is shown between the rows of capacitors 804, the rows could be farther apart or closer together (e.g., the rows could touch), as well. The twelve capacitors 804 are arranged along substantially parallel planes. The side segments 904 of four terminals are visible on each capacitor 804, and the terminals alternate between positive and negative polarities, as indicated by the alternating cross-hatching patterns.

Similar to the embodiment described in FIG. 6, using various embodiments of the present invention, more discrete capacitors can be vertically embedded within the package 502 within the same cross-sectional package area than can be horizontally embedded within the package using prior art methods. Although only twelve capacitors 804 are shown in the figure, more or fewer capacitors could be used as well.

Also similar to the embodiment described in FIG. 6, in one embodiment, two or more of the vertically embedded capacitors 804 are also laterally connected together. This means that some of the terminals 814 and/or 816 (FIG. 8) of adjacent, discrete capacitors 804 are electrically connected together without relying on electrical connections formed from conductive structures within package 802. The lateral connections between terminals 814 and/or 816 (FIG. 8) of adjacent ECCs 804 are made in a similar manner to those discussed in conjunction with FIGS. 6 and 7. In other embodiments, capacitors 804 are not laterally connected together.

In one embodiment, the lateral connections are achieved using a conductive material between the adjacent terminals 814 and/or 816 (FIG. 8). This conductive material could be, in various embodiments, solder or a cured, conductive paste or adhesive, for example. The conductive material could also be used to connect the capacitors 804 to the package's internal conductive structures, or separate applications of conductive material could be used to achieve the terminal-to-package and terminal-to-terminal connections.

In accordance with the various embodiments, because capacitors 804 are interconnected directly through lateral connections, and are not interconnected only through conductive structures within the package, the lateral inductance between the capacitors 804 is substantially reduced. As with the embodiment described in conjunction with FIGS. 6 and 7, this results in substantially reduced system noise and more effective usage of bypassing capacitors. In addition, by reducing the system noise, the various embodiments can increase manufacturing yields and decrease the number of bypassing capacitors needed, thus reducing costs.

Figure 10:
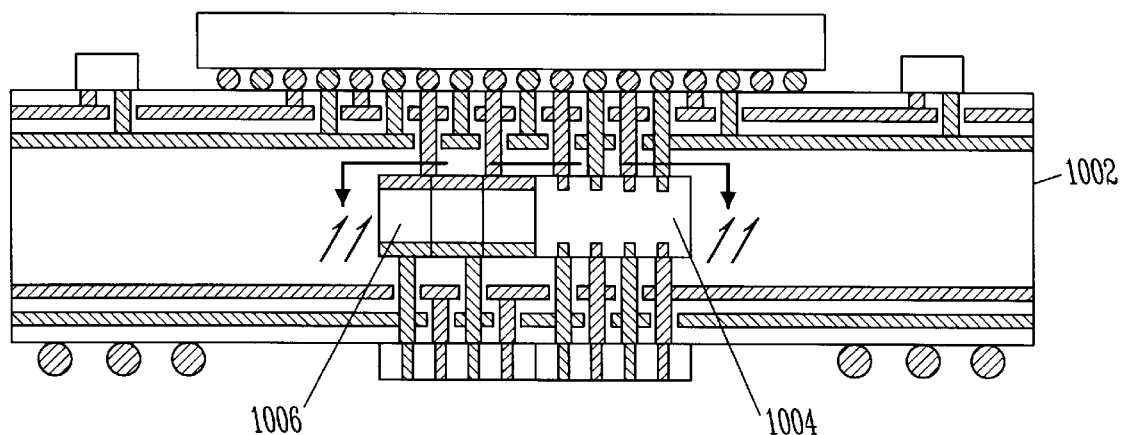
FIG. 10 illustrates a cross-sectional view of an integrated circuit package having multiple embedded capacitors in accordance with another embodiment of the present invention.

FIG. 10 illustrates a cross-sectional view of an integrated circuit package 1002 having multiple ECCs 1004, 1006 in accordance with another embodiment of the present invention. The embodiment illustrated in FIG. 10 is similar to the embodiment illustrated in FIGS. 8 and 9, except that ECCs 1004, 1006 are not all oriented along parallel planes. Instead, some ECCs 1006 are oriented along perpendicular planes to other ECCs 1004.

Figure 11:
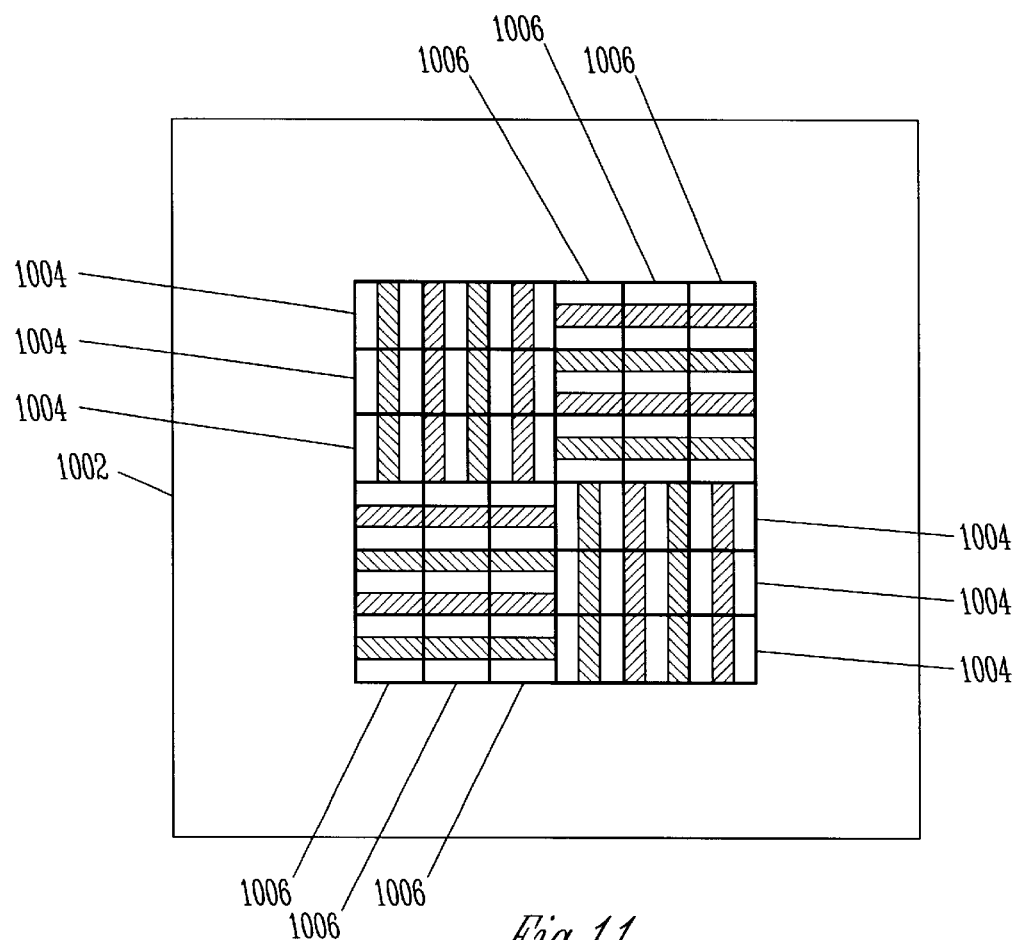
FIG. 11 illustrates a cross-sectional view of a portion of the integrated circuit package of FIG. 10 along section lines A—A.

This is further depicted in FIG. 11, which illustrates a cross-sectional view of a portion of the integrated circuit package 1002 of FIG. 10 along section lines A—A. As mentioned above, the figure shows that some ECCs 1004 are oriented along first parallel planes, while other ECCs 1006 are oriented along second parallel planes, which are perpendicular to the first parallel planes.

FIGS. 10 and 11 illustrate that vertically and/or laterally connected capacitors can be arranged in numerous different orientations. This is the case for both surface mounted and embedded capacitor configurations.

As mentioned previously, discrete capacitors having more or fewer terminals than the eight-terminal capacitors described above could also be used in various embodiments. In addition, capacitors having terminals on more than two sides also could be used in various embodiments.

In some cases, a capacitor may have one or more terminals that extend the entire length of one or more sides of the capacitor. These terminals are referred to herein as "extended terminals." This extended terminal feature of certain discrete capacitors is exploited, in one embodiment, to further improve lateral inductance and to provide additional DC shunts thorough the package. FIGS. 12–15 illustrate various embodiments where ten-terminal, discrete capacitors are vertically connected and embedded within a package, providing additional bypassing capacitance, low lateral inductance, a low inductance path between LSCs and a die load, and additional DC shunts through the package.

Figure 12:
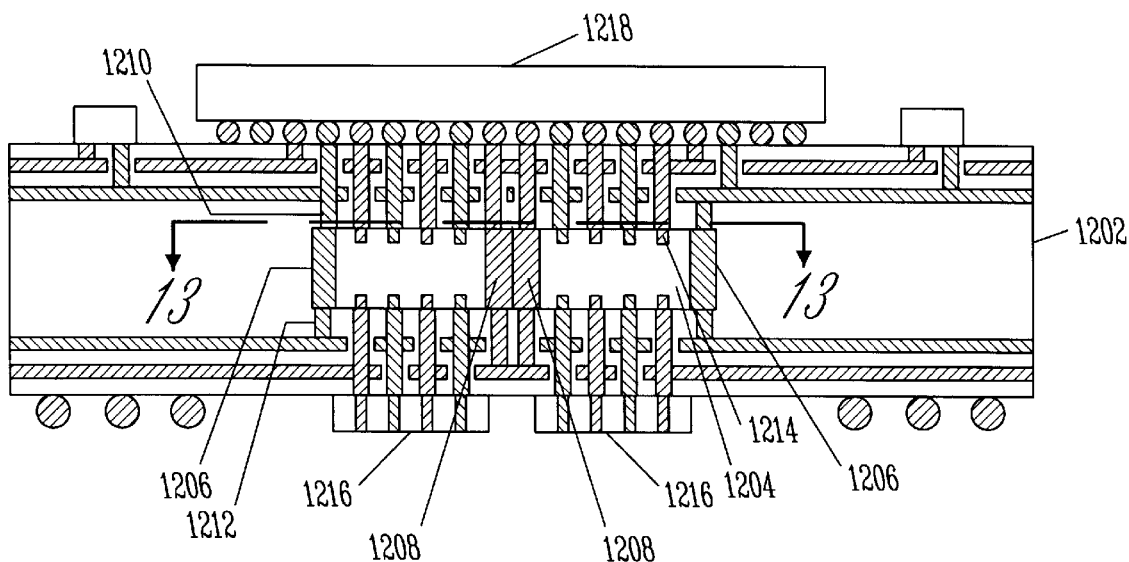
FIG. 12 illustrates a cross-sectional view of an integrated circuit package having multiple embedded capacitors in accordance with another embodiment of the present invention.

FIG. 12 illustrates a cross-sectional view of an integrated circuit package 1202 having multiple embedded capacitors 1204 in accordance with another embodiment of the present invention. The embodiment illustrated in FIG. 12 is similar to the embodiment illustrated in FIGS. 8 and 9, in that ECCs 1204 are vertically embedded within package 1202. The embodiment illustrated in FIG. 12 differs, however, in that ECCs 1204 having extended terminals 1206, 1208 on two sides are embedded within the package, and these extended terminals provide a connection between die-side vias 1210 and land-side vias 1212. Basically, one end of an extended terminal 1206, 1208 is connected to a die-side via 1210, and the other end of the extended terminal 1206, 1208 is connected to a land-side via 1212.

These die-side to land-side via connections, implemented through extended terminals 1206, 1208, provide additional DC current shunts through the package. These additional DC shunts are particularly useful in high current applications, although they are also useful in lower current applications. In addition, in one embodiment, adjacent, extended terminals 1208, which have the same polarity, are laterally connected. This provides a high frequency current redistribution path between rows of capacitors 1204. These lateral connections will be described in more detail in conjunction with FIG. 13. In other embodiments, extended terminals 1208 of adjacent capacitors 1204 are not laterally connected.

In one embodiment, ECCs 1204 also include additional terminals 1214 along one or more sides that are perpendicular to the sides upon which the extended terminals 1206, 1208 exist. These additional terminals 1214 are connected to die-side vias 1210 and land-side vias 1212 in the manner described in conjunction with FIGS. 8 and 9, thus enabling capacitors 1204 to provide a low inductance, high frequency path between LSCs 1216 and die 1218.

Although FIG. 12 illustrates a ten-terminal discrete capacitor 1204 having an extended terminal 1206, 1208 on two sides and four additional terminals 1214 on each of the other two sides, capacitors 1204 having more or fewer extended terminals and/or additional terminals 1214 could be used as well. For example, two-terminal capacitors, each having only two extended terminals, could be used in another embodiment.

Figure 13:
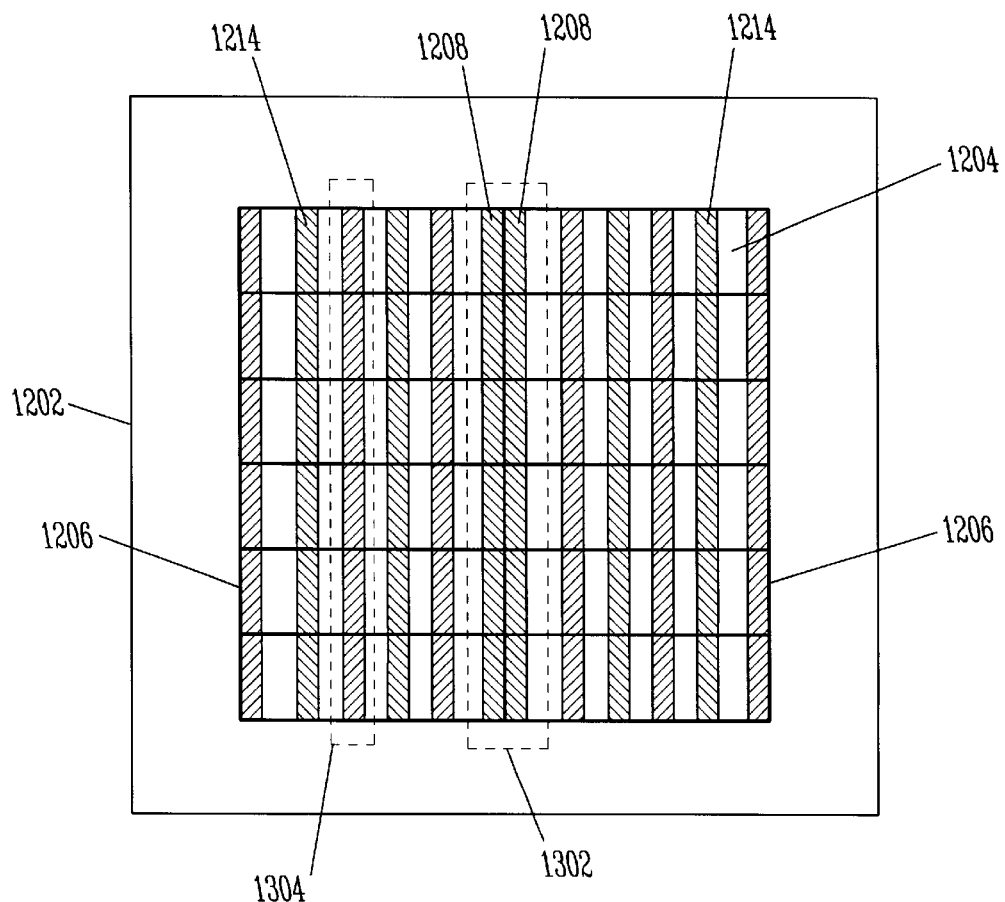
FIG. 13 illustrates a cross-sectional view of a portion of the integrated circuit package of FIG. 12 along section lines A—A.

FIG. 13 illustrates a cross-sectional view of a portion of the integrated circuit package 1202 of FIG. 12 along section lines A—A. The embodiment illustrated in FIG. 13 is similar to the embodiment illustrated in FIG. 9, except that not only are additional terminals 1214 laterally connected within a row of capacitors, but the two rows of ECCs 1204 are also laterally connected together through extended terminals 1208.

The row-to-row lateral connection is between adjacent terminals 1208 having the same polarity. In this manner, a lateral current path 1302 is formed between the two rows of capacitors 1204, as well as having lateral current paths 1304 along each row. One difference between paths 1302 and 1304 is that the extended terminal path 1302 also provides a direct connection between die-side and land-side vias (e.g., vias 1210, 1212, FIG. 12), whereas the other terminal paths 1304 do not provide direct connections between die-side and land-side vias.

The embodiments shown in FIGS. 12 and 13 show the rows of capacitors 1204 as being in physical contact with each other. In other embodiments, the rows of capacitors 1204 could have a non-negligible distance between each other, and one or more lateral connections between rows of capacitors 1204 could be formed to span that distance.

In the embodiments illustrated in FIGS. 12 and 13, the supply and return paths for the DC current are separated by approximately the length of a capacitor 1204. In other words, if extended terminals 1208 are used to supply current, and terminals 1206 are used to return current, the loop area is partially defined by the distance between terminals 1208 and 1206. This loop area results in a certain amount of inductance in the supply and return loop. In another embodiment, this loop area, and thus the inductance, is reduced by eliminating the lateral connections between rows of capacitors so that the supply and return paths can be closer together. This embodiment is described in conjunction with FIGS. 14 and 15.

Figure 14:
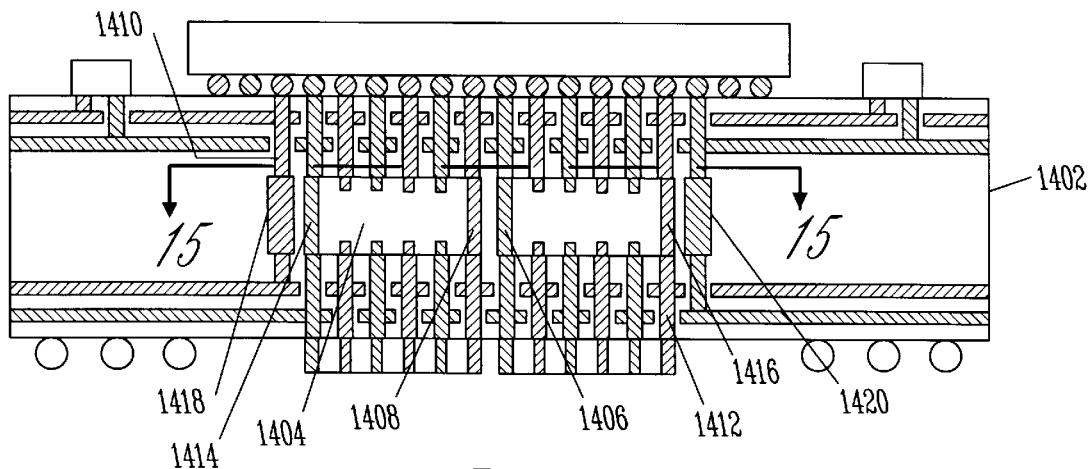
FIG. 14 illustrates a cross-sectional view of an integrated circuit package having multiple embedded capacitors in accordance with another embodiment of the present invention.

FIG. 14 illustrates a cross-sectional view of an integrated circuit package 1402 having multiple embedded capacitors 1404 in accordance with another embodiment of the present invention. The embodiment illustrated in FIG. 14 is similar to the embodiment illustrated in FIGS. 12 and 13, in that ECCs 1404 having extended terminals 1406, 1408 on two sides are embedded within the package, and these extended terminals provide a connection between die-side vias 1410 and land-side vias 1412. The embodiment illustrated in FIG. 14 differs, however, in that extended terminals 1406, 1408 are not laterally connected across the rows of capacitors 1404, and capacitors 1404 are arranged so that extended terminals 1406, 1408 having opposite polarities are adjacent to each other across the rows of capacitors 1404. The extended terminals 1406, 1408, which are adjacent to each other across the rows, are referred to herein as "inner extended terminals." The extended terminals 1414, 1416 which are not adjacent to other terminals across the rows, are referred to herein as "outer extended terminals."

In this embodiment, inner extended terminals 1406 having a first polarity act as the supply path for DC current, and outer extended terminals 1408 having a second polarity act as the return path for the DC current. Unlike the embodiment illustrated in FIGS. 12 and 13, the loop area for the supply and return is defined by the distance between rows, rather than by the distance between a capacitor's inner and outer extended terminals (i.e., approximately the length of the capacitor). Accordingly, when the rows are placed in close proximity, the loop area can be significantly smaller, resulting in a significantly reduced inductance for the supply and return loop.

In one embodiment, additional supply and return paths are provided within the package for the outer extended terminals 1414, 1416. These additional supply and return paths are implemented through additional conductive structures 1418, 1420, which are in close proximity to the outer extended terminals 1414, 1416. Thus, for example, if extended terminal 1414 acts as a DC supply path, structure 1418 could act as the associated DC return path. By providing additional supply and return paths through structures 1418, 1420, the DC supply and return loop area can be significantly smaller, resulting in a significantly reduced inductance associated with the outer extended terminals 1414, 1416.

In one embodiment, the additional supply and return paths 1418, 1420 could be planar conductive structures within package 1402, which are arranged along substantially parallel planes from outer extended terminals 1414, 1416. In another embodiment, the additional supply and return paths 1418, 1420 could be formed from multiple conductive vias, which run vertically through substantially parallel planes from outer extended terminals 1414, 1416.

Figure 15:
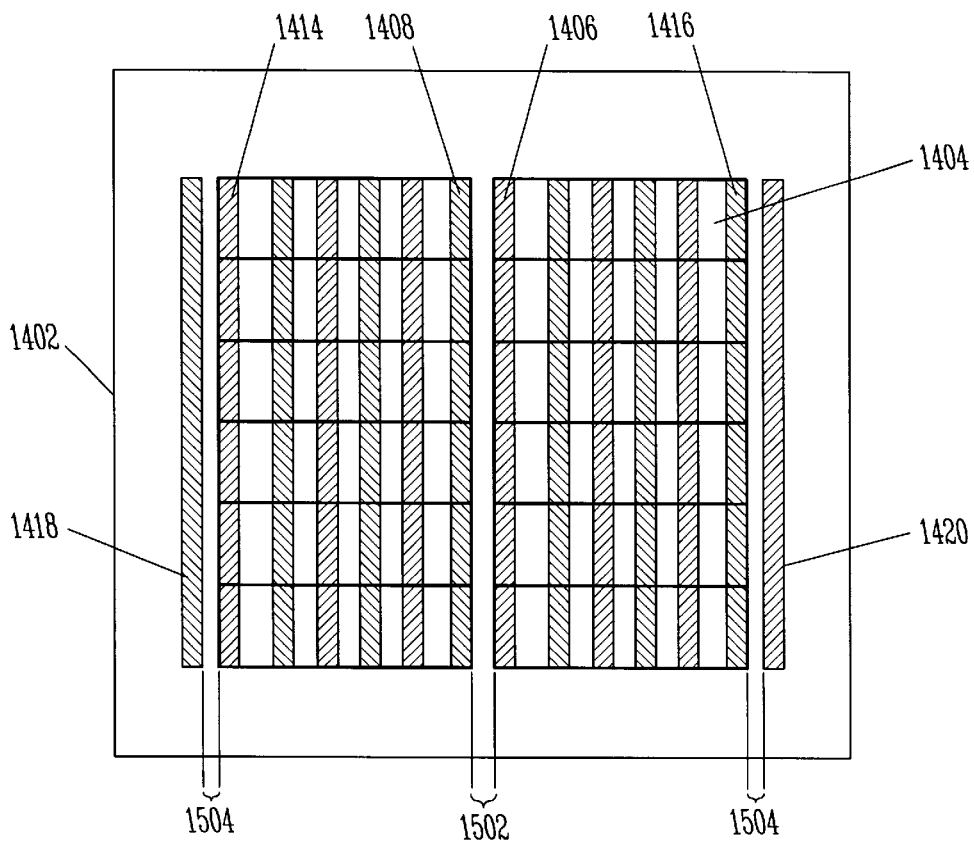
FIG. 15 illustrates a cross-sectional view of a portion of the integrated circuit package of FIG. 14 along section lines A—A.

FIG. 15 illustrates a cross-sectional view of a portion of the integrated circuit package 1402 of FIG. 14 along section lines A—A. The embodiment illustrated in FIG. 15 is similar to the embodiment illustrated in FIG. 13, except that the rows of capacitors 1404 are not laterally connected, even though lateral connections still exist between the capacitors 1404 within each row. In addition, the inner extended terminals 1406, 1408 of the first row and the second row are of opposite polarities. This is also true of the outer extended terminals 1414, 1416, and additional supply and return conductive structures 1418, 1420 exist within the package 1402, to reduce the inductance of the current path partially provided by these outer extended terminals 1414, 1416.

A gap 1502 exists between the rows of capacitors 1404 in order to electrically isolate the first row's inner terminals 1406 from the second row's inner terminals 1408. Similarly, gaps 1504 also exist between the outer terminals 1414, 1416 and the additional conductive structures 1418, 1420. In one embodiment, these gaps 1502, 1504 are filled with a non-conducting material, although the gaps could be left unfilled, as well. The width of gaps 1502, 1504 partially define the loop area between the DC current supply and return paths. Therefore, in one embodiment, gaps 1502, 1504 are made as small as possible, while still ensuring an acceptable level of reliability and manufacturing yield.

In various embodiments, each capacitor 506, 804, 1004, 1204, and 1404 illustrated in FIGS. 5-15 could be a ceramic capacitor, aluminum oxide capacitor, organic capacitor or a capacitor made with many other technologies, as would be obvious to one of skill in the art based on the description herein. In addition, the actual and relative dimensions of capacitors 506, 804, 1004, 1204, and 1404 could vary widely, depending on design and manufacturing constraints or other factors. In addition, capacitors 506, 804, 1004, 1204, and 1404 need not necessarily be rectangular in shape, as they could assume a number of different shapes (e.g., square or multi-sided).

Figure 16:
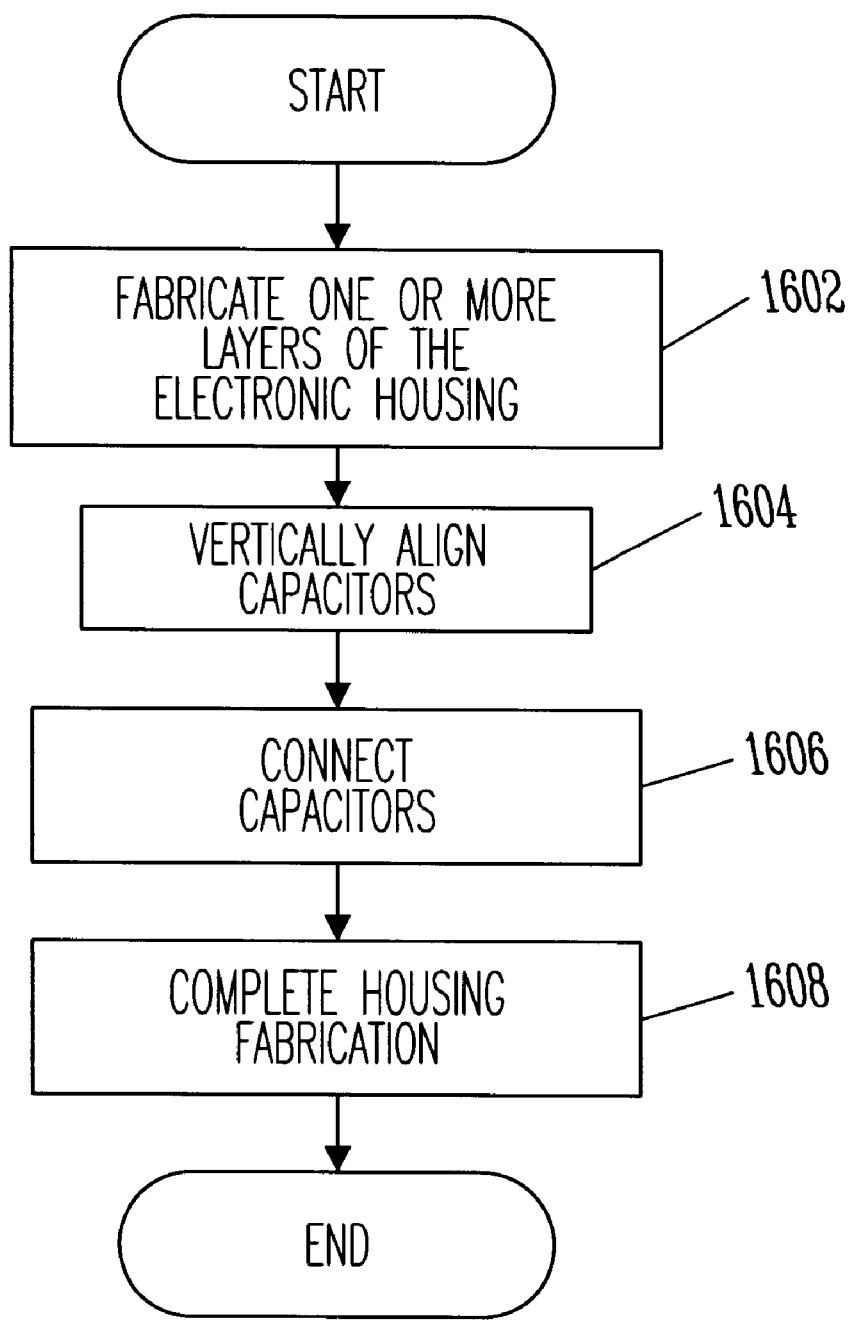
FIG. 16 illustrates a flowchart of a method for manufacturing an electronic assembly having vertically connected capacitors in accordance with one embodiment of the present invention.

FIG. 16 illustrates a flowchart of a method for manufacturing an electronic assembly having vertically connected capacitors in accordance with one embodiment of the present invention. The method begins, in block 1602, by fabricating one or more layers of an electronic housing, along with one or more conductive structures (e.g., pads, vias, and/or conductive traces and planes). The electronic housing could be, for example, an integrated circuit package, other type of package, interposer, printed circuit (PC) board, or other type of electronic circuit housing. The details regarding fabricating the housing layer(s) depend entirely on the type of packaging technology used, and a discussion of the various packaging technology fabrication methods are outside of the scope of this invention. Fabrication of the electronic housing layers results in a rigid structure with conductive pads on its surface and/or other exterior or interior conductive structures.

In block 1604, two or more discrete capacitors are vertically aligned with the electronic housing. Where the discrete capacitors are LSCs or DSCs, vertical alignment involves aligning the capacitors with pads on the surface of the electronic housing. Where the discrete capacitors are ECCs, vertical alignment involves aligning the capacitors with vias or other internal conductive structures. Whether the package's conductive structures are pads, vias, or some other structures, the side segments of one or more terminals are aligned with the conductive structures so that the side of the capacitor on which the side segments reside is substantially parallel to a top or bottom surface of the housing.

After vertically aligning the capacitors, the capacitors are connected to conductive structures within the housing, in block 1606, using solder reflow or other connection techniques. In one embodiment, one or more terminals of one or more adjacent capacitors are also connected together with a lateral connection (e.g., as shown in FIG. 7). Connection of the capacitors to the housing and to each other can be done in separate processes, or can be done simultaneously. For example, the discrete capacitors can first be surface mounted to the housing pads, and then the adjacent capacitors' terminals can be laterally connected in a separate process. Alternatively, the surface mounting and lateral connection can be performed simultaneously, for example, by soldering the pads and adjacent terminals together at the same time. Alternatively, a cured, conductive paste or adhesive could be used to provide the capacitor-to-pad and/or lateral connections.

Where the discrete capacitors are ECCs, the capacitors would be aligned on the top layer of the partial housing or within depressions within the housing. The ECCs would then be vertically connected to conductive structures within the housing and/or laterally connected to each other using one or several processes. In the embodiments where capacitors having extended terminals are used to provide DC shunts (e.g., as shown in FIGS. 12–15), the ends of the extended terminals are connected to conductive structures of the electronic housing.

After vertically connecting the discrete capacitors, the housing fabrication is completed, if necessary, in block 1608. In the case of ECCs, this may include building up one or more additional layers of patterned conductive and dielectric materials over the ECCs, including the formation of vias and/or other conductive structures that provide electrical connections to the ECCs' terminals. In addition, in the case of the embodiments described in conjunction with FIGS. 14 and 15, this may include building additional conductive structures (e.g., structures 1418, 1420) within the housing. The process then ends.

Figure 17:
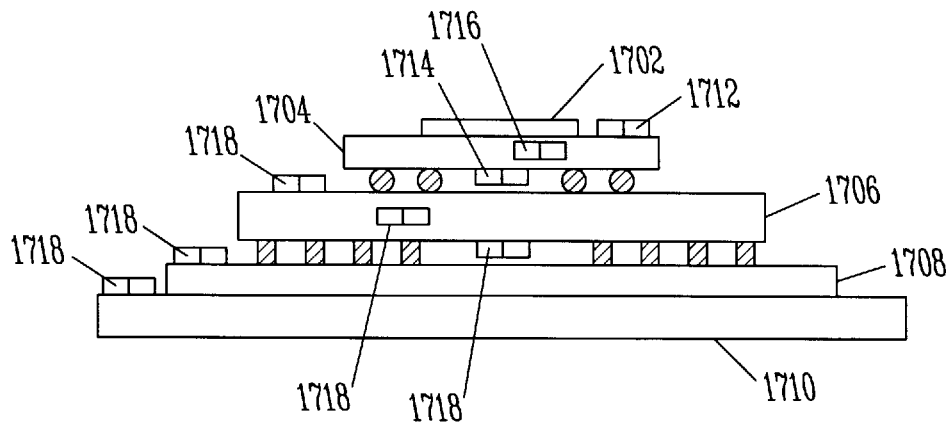
FIG. 17 illustrates an integrated circuit package, interposer, socket, and printed circuit board, each of which could include one or more sets of vertically connected capacitors in accordance with various embodiments of the present invention.

As described previously, vertically connected capacitors, such as those described in the various embodiments above, can be included on or within an integrated circuit package, interposer, socket, PC board, and/or other types of electronic circuit housing. FIG. 17 illustrates an integrated circuit package 1704, interposer 1706, socket 1708, and PC board 1710, each of which could include one or more sets of vertically connected capacitors in accordance with various embodiments of the present invention.

Starting from the top of FIG. 17, an integrated circuit 1702 is housed by integrated circuit package 1704. Integrated circuit 1702 contains one or more circuits, which are electrically connected to integrated circuit package 1704 by connectors (not shown).

Integrated circuit 1702 could be any of a number of types of integrated circuits. In one embodiment of the present invention, integrated circuit 1702 is a microprocessor. In other embodiments, integrated circuit 1702 could be a memory device, application specific integrated circuit, digital signal processor, or another type of device. In the example shown, integrated circuit 1702 is a "flip chip" type of integrated circuit, meaning that the input/output terminations on the chip can occur at any point on its surface. After the chip has been readied for connection to integrated circuit package 1704, it is flipped over and connected, via solder bumps or balls to matching pads on the top surface of integrated circuit package 1704. Alternatively, integrated circuit 1702 could be wire bonded, where input/output terminations are connected to integrated circuit package 1704 using bond wires to pads on the top surface of integrated circuit package 1704, or otherwise connected to package 1704.

One or more of the circuits within integrated circuit 1702 acts as a load, which may require bypassing capacitance for noise or radiation suppression, and/or voltage dampening. Some of this capacitance is provided, in one embodiment of the present invention, by vertically connected DSCs 1712, LSCs 1714, and/or ECCs 1716, which are vertically surface mounted on and/or embedded within package 1704. In this manner, one or more levels of additional capacitance are provided to integrated circuit 1702. In other embodiments, vertically connected capacitors 1718 are surface mounted on and/or embedded within interposer 1706, socket 1708, and/or PC board 1710.

Integrated circuit package 1704 is coupled to interposer 1706 using solder connections, such as ball grid array connections, for example. In another embodiment, integrated circuit package 1704 could be electrically and physically connected to interposer 1706 using a pinned or other type of connection.

Interposer 1706 is coupled to PC board 1710 through a socket 1708 on PC board 1710. In the example shown, interposer 1706 includes pins, which mate with complementary pin holes in socket 1708. Alternatively, interposer 1706 could be electrically and physically connected to PC board 1710 using solder connections, such as ball grid array connections, for example. In still another alternate embodiment, integrated circuit package 1704 could be connected directly to socket 1708 and/or PC board 1710, without using an interposer. In such an embodiment, integrated circuit package 1704 and PC board 1710 could be electrically and physically connected using ball grid array or pinned connections. Other ways of connecting integrated circuit package 1704 and PC board 1710 could also be used in other embodiments.

PC board 1710 could be, for example, a motherboard of a computer or other electronic system. As such, it acts as a vehicle to supply power, ground, and signals to integrated circuit 1702. These power, ground, and other signals are supplied through traces or planes (not shown) on or within PC board 1710, socket 1708, interposer 1706, and integrated circuit package 1704.

Figure 18:
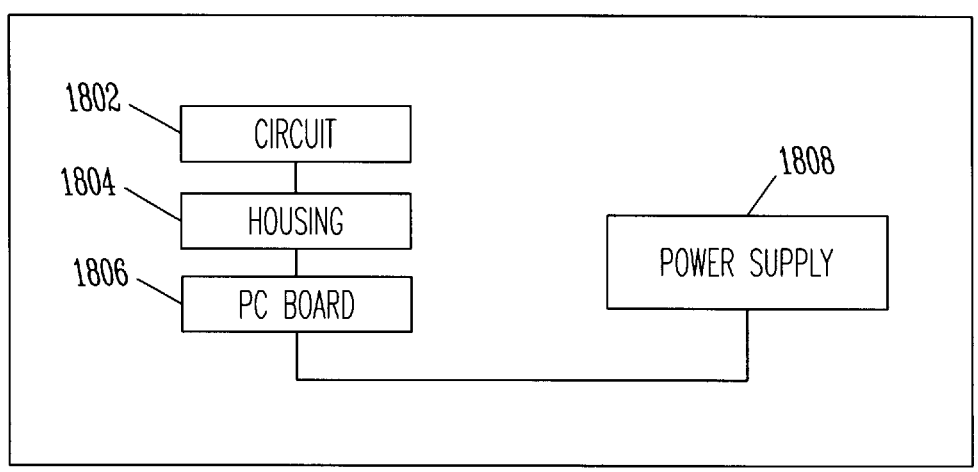
FIG. 18 illustrates an electronic system in accordance with one embodiment of the present invention.

The configurations described above in conjunction with various embodiments could form part of an electronic system. FIG. 18 illustrates an electronic system in accordance with one embodiment of the present invention. The system shown in FIG. 18 could be, for example, a computer, a wireless or wired communication device (e.g., telephone, modem, cell phone, pager, radio, etc.), a television, a monitor, or virtually any other type of electronic system that could benefit from the use of vertically connected capacitors.

The electronic system includes circuit 1802, housing 1804, PC board 1806, and power supply 1808. Housing 1804 and/or PC board 1806 include one or more conductive structures connected to two or more vertically connected, discrete capacitors, which are surface mounted on or embedded within housing 1804 or PC board 1806, in accordance with various embodiments of the present invention.

CONCLUSION

Various embodiments of an electronic assembly with vertically connected capacitors and methods of fabricating that assembly have been described, along with a description of the incorporation of the assembly within an electronic system. The various embodiments can be used to reduce the vertical and lateral inductance present between LSCs, DSCs, ECCs or other discrete capacitor configurations. In addition, by vertically connecting capacitors, more capacitors can be connected within the same surface area or cross sectional area of a housing. Accordingly, more capacitance can be provided to the die or other loads without increasing the size of the housing. Also, in some embodiments, extended capacitor terminals are used to provide additional DC shunts within the package.

In various embodiments, the extremely low lateral inductance inside multi-layer capacitors is exploited by laterally connecting the terminals of adjacent, discrete capacitors together, rather than relying on electrical connections formed from conductive structures within or on the surface of the package. These lateral connections result in extremely low lateral inductances between LSCs, DSCs, and ECCs. By utilizing lateral connections between the numerous conductive planes within the discrete capacitors, the various embodiments provide a high frequency current redistribution network for the power delivery system.

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, although some of the figures show twelve discrete capacitors arranged in two rows, more or fewer capacitors could be used, and they could be arranged in more or fewer rows and/or in other pattern configurations, including linear, ring or irregularly shaped configurations.

The various embodiments have been described in the context of providing excess, off-chip capacitance to a die. One of ordinary skill in the art would understand, based on the description herein, that the method and apparatus of the present invention could also be applied in many other applications where a capacitor configuration having a low vertical and/or lateral inductance is desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps, which have been described and illustrated in order to explain the nature of this invention, may be made without departing from the spirit and scope of the invention as expressed in the adjoining claims.

What is claimed is:

1. An electronic assembly comprising:
   a housing having one or more conductive structures, a top housing surface, and a bottom housing surface; and
   a first discrete capacitor connected to the housing, the first discrete capacitor having a top capacitor surface, a bottom capacitor surface substantially parallel with the top capacitor surface, and a first side of an exterior of the first discrete capacitor, the first side being substantially perpendicular to the top capacitor surface and the bottom capacitor surface, and the first discrete capacitor also having multiple first interior planes substantially parallel with the top capacitor surface and the bottom capacitor surface, wherein a set of the multiple first interior planes electrically connects to one or more first conductive terminals on the first side, and wherein one or more first side segments of the one or more first conductive terminals are located on the first side and are connected to the one or more conductive structures so that the first side is substantially parallel to the to housing surface and the bottom housing surface.

2. The electronic assembly as claimed in claim 1, wherein the first discrete capacitor is surface mounted to the housing, and the one or more first side segments are connected to one or more pads on a surface of the housing.

3. The electronic assembly as claimed in claim 1, wherein the housing is an integrated circuit package, and the first discrete capacitor is mounted on a land side of the integrated circuit package.

4. The electronic assembly as claimed in claim 1, wherein the housing is an integrated circuit package, and the first discrete capacitor is mounted on a die side of the integrated circuit package.

5. The electronic assembly as claimed in claim 1, wherein the first discrete capacitor is a ceramic chip capacitor.

6. The electronic assembly as claimed in claim 1, wherein the first discrete capacitor is an organic capacitor.

7. An electronic assembly comprising:
   a housing having one or more conductive structures; and
   a first discrete capacitor connected to the housing, the first discrete capacitor having multiple first interior planes, wherein a set of the multiple first interior planes electrically connects to one or more first conductive terminals on a first side of an exterior of the first discrete capacitor, and wherein one or more first side segments of the one or more first conductive terminals are connected to the one or more conductive structures so that the first side is substantially parallel to a top surface of the housing, and wherein the first discrete capacitor is embedded within the housing, and the one or more first side segments are connected to one or more conductive structures embedded within the housing.

8. The electronic assembly as claimed in claim 7, wherein the first discrete capacitor also includes one or more second conductive terminals on a second side of the first discrete capacitor, and wherein the second side is opposite the first side, and one or more second side segments of the one or more second conductive terminals are connected to the one or more other conductive structures.

9. The electronic assembly as claimed in claim 7, wherein the one or more conductive structures are first vias that extend toward a top surface of the housing.

10. The electronic assembly as claimed in claim 9, wherein the first discrete capacitor also includes one or more second conductive terminals on a second side of the first discrete capacitor, and wherein one or more second side segments of the one or more second conductive terminals are connected to one or more second vias that extend toward a bottom surface of the housing.

11. The electronic assembly as claimed in claim 10, wherein one or more additional discrete capacitors are surface mounted to the bottom surface, and are at least partially electrically connected to the one or more second conductive terminals through the one or more second vias.

12. An electronic assembly comprising:
    a housing having one or more conductive structures; and
    a first discrete capacitor connected to the housing, the first discrete capacitor having multiple first interior planes, wherein a set of the multiple first interior planes electrically connects to one or more first conductive terminals on a first side of an exterior of the first discrete capacitor, and wherein one or more first side segments of the one or more first conductive terminals are connected to the one or more conductive structures so that the first side is substantially parallel to a top surface of the housing, and wherein the first discrete capacitor also includes a first extended terminal, which extends a length of a second side of the first discrete capacitor, and wherein the second side is perpendicular to the first side, and one end of the first extended terminal is connected to one or more first vias that extend toward a top surface of the housing, and another end of the first extended terminal is connected to one or more second vias that extend toward a bottom surface of the housing.

13. The electronic assembly as claimed in claim 12, further comprising a second discrete capacitor connected to the housing, the second discrete capacitor having a second extended terminal, wherein the second extended terminal is laterally connected to the first extended terminal.

14. The electronic assembly as claimed in claim 13, wherein the first discrete capacitor and the second discrete capacitor are in a first row of vertically connected discrete capacitors.

15. The electronic assembly as claimed in claim 13, wherein the first discrete capacitor is in a first row of vertically connected discrete capacitors and the second discrete capacitor is in a second row of vertically connected discrete capacitors.

16. The electronic assembly as claimed in claim 12, further comprising a second discrete capacitor connected to the housing, the second discrete capacitor having a second extended terminal, wherein the first discrete capacitor is in a first row of vertically connected discrete capacitors and the second discrete capacitor is in a second row of vertically connected discrete capacitors.

17. The electronic assembly as claimed in claim 16, wherein the first extended terminal has an opposite polarity from the second extended terminal, the first extended terminal and the second extended terminal are adjacent to one another across the first row and the second row, and the first extended terminal and the second extended terminal are not laterally connected together.

18. The electronic assembly as claimed in claim 17, wherein the first discrete capacitor also includes a third extended terminal on an opposite side of the first discrete capacitor from the first extended terminal, the second discrete capacitor also includes a fourth extended terminal on an opposite side of the second discrete capacitor from the second extended terminal, and wherein the housing further includes one or more additional conductive structures in close proximity to the third extended terminal and the fourth extended terminal, wherein the one or more additional conductive structures provide supply or return paths for current carried by the third extended terminal and the fourth extended terminal.

19. An electronic assembly comprising:
a housing having one or more conductive structures;
a first discrete capacitor connected to the housing, the first discrete capacitor having multiple first interior planes, wherein a set of the multiple first interior planes electrically connects to one or more first conductive terminals on a first side of an exterior of the first discrete capacitor, and wherein one or more first side segments of the one or more first conductive terminals are connected to the one or more conductive structures so that the first side is substantially parallel to a top surface of the housing; and
one or more additional discrete capacitors connected to the housing, each of the additional discrete capacitors having multiple second interior planes, wherein a set of the multiple second interior planes electrically connects to one or more second conductive terminals on an exterior of each of the additional discrete capacitors, and wherein the one or more second conductive terminals are laterally connected to one or more terminals of the first discrete capacitor.

20. The electronic assembly as claimed in claim 19, wherein the one or more second conductive terminals and the one or more terminals of the first discrete capacitor are laterally connected using a conductive material.

21. The electronic assembly as claimed in claim 19, wherein the first discrete capacitor and the one or more additional discrete capacitors form a first row of capacitors.

22. An electronic assembly comprising:
a housing having one or more conductive structures; and
a first discrete capacitor connected to the housing, the first discrete capacitor having multiple first interior planes, wherein a set of the multiple first interior planes electrically connects to one or more first conductive terminals on a first side of an exterior of the first discrete capacitor, and wherein one or more first side segments of the one or more first conductive terminals are connected to the one or more conductive structures so that the first side is substantially parallel to a top surface of the housing, and wherein the housing is an integrated circuit package, and the first discrete capacitor is embedded within the integrated circuit package.

23. An electronic system comprising:
a housing having one or more conductive structures; and
a first discrete capacitor connected to the housing, the first discrete capacitor having multiple first interior planes, wherein a set of the multiple first interior planes electrically connects to one or more first conductive terminals on a first side of an exterior of the first discrete capacitor, and wherein one or more first side segments of the one or more first conductive terminals are connected to the one or more conductive structures so that the first side is substantially parallel to a top or bottom surface of the housing.

24. The electronic system as claimed in claim 23, wherein the first discrete capacitor is embedded within the housing.

25. The electronic system as claimed in claim 23, wherein the first discrete capacitor is mounted on a surface of the housing.

26. The electronic system as claimed in claim 23, further comprising a microprocessor electrically connected to the housing.

27. An electronic assembly comprising:
a housing with a top housing surface, a bottom housing surface, and electrically conductive structures located on and between the top housing surface and the bottom housing surface; and
a discrete capacitor connected to the housing, the discrete capacitor having a top capacitor surface, a bottom capacitor surface that is substantially parallel with the top capacitor surface, a side that is substantially perpendicular to the top capacitor surface and the bottom capacitor surface, and electrically conductive layers that are substantially parallel with and located between the top capacitor surface and the bottom capacitor surface, and wherein some of the conductive layers electrically connect to an electrically conductive terminal on the side of the discrete capacitor, and the conductive terminal is connected to one or more of the electrically conductive structures of the housing so that the side of the discrete capacitor is substantially parallel with the top housing surface.

28. The electronic assembly as claimed in claim 27, wherein the discrete capacitor is electrically connected to one or more electrically conductive pads on a surface of the housing.

29. The electronic assembly as claimed in claim 22, wherein the housing is an integrated circuit package, and the discrete capacitor is mounted on the top housing surface.

30. The electronic assembly as claimed in claim 27, wherein the housing is an integrated circuit package, and the discrete capacitor is mounted on the bottom housing surface.

31. The electronic assembly as claimed in claim 27, wherein the discrete capacitor is a ceramic chip capacitor.

32. The electronic assembly as claimed in claim 27, wherein the discrete capacitor is an organic capacitor.

33. An electronic assembly comprising:
a housing with a top housing surface, a bottom housing surface, and electrically conductive structures located on and between the top housing surface and the bottom housing surface; and
a discrete capacitor connected to the housing, the discrete capacitor having a top capacitor surface, a bottom capacitor surface, and electrically conductive layers that are substantially parallel to and located between the top capacitor surface and the bottom capacitor surface, and wherein some of the conductive layers electrically connect to an electrically conductive terminal on a side of the discrete capacitor, and the conductive terminal is connected to the housing so that the side is substantially parallel to the top housing surface, and wherein the discrete capacitor is embedded between the top housing surface and the bottom housing surface.

34. An electronic assembly comprising:

a housing with a top housing surface, a bottom housing surface, and electrically conductive structures located on and between the top housing surface and the bottom housing surface;

a discrete capacitor connected to the housing, the discrete capacitor having a top capacitor surface, a bottom capacitor surface, and electrically conductive layers that are substantially parallel to and located between the top capacitor surface and the bottom capacitor surface, and wherein some of the conductive layers electrically connect to an electrically conductive terminal on a side of the discrete capacitor, and the conductive terminal is connected to the housing so that the side is substantially parallel to the top housing surface; and a second capacitor, which is electrically connected through a side capacitor terminal to the housing, and wherein the side capacitor terminal also is laterally connected to the electrically conductive terminal of the discrete capacitor.

35. An electronic assembly comprising:

a housing with a top housing surface, a bottom housing surface, and electrically conductive structures located on and between the top housing surface and the bottom housing surface; and a discrete capacitor connected to the housing, the discrete capacitor having a top capacitor surface, a bottom capacitor surface, and electrically conductive layers that are substantially parallel to and located between the top capacitor surface and the bottom capacitor surface, and wherein some of the conductive layers electrically connect to an electrically conductive terminal on a side of the discrete capacitor, and the conductive terminal is connected to the housing so that the side is substantially parallel to the top housing surface, and wherein the housing is an integrated circuit package, and the discrete capacitor is embedded between the top housing surface and the bottom housing surface.

* * * * *

UNITED STATES PATENT AND TRADEMARK OFFICE
CERTIFICATE OF CORRECTION

PATENT NO.    : 6,713,860 B2
DATED         : March 30, 2004
INVENTOR(S)   : Li

It is certified that error appears in the above-identified patent and that said Letters Patent is hereby corrected as shown below:

Column 17,
Line 40, delete "to" and insert -- top --, therefor.

Column 20,
Line 46, delete "claim 22" and insert -- claim 27 --, therefor.

Signed and Sealed this

Twentieth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,713,860 B2
DATED : March 30, 2004
INVENTOR(S) : Atsuji Nakagawa

It is certified that error appears in the above-identified patent and that said Letters Patent is hereby corrected as shown below:

<u>Title page,</u>
Insert Item:
-- [30] Foreign Application Priority Data
February 1, 2002      (JP)     2002-026070 --

Signed and Sealed this

Eighteenth Day of January, 2005

JON W. DUDAS
*Director of the United States Patent and Trademark Office*